(12) United States Patent
Stoica et al.

(10) Patent No.: US 12,730,163 B2
(45) Date of Patent: Sep. 8, 2026

(54) HALL SENSOR SYSTEM BIASED IN CURRENT

(71) Applicant: Infineon Technologies AG, Neubiberg (DE)

(72) Inventors: Dan Ioan Dumitru Stoica, Bucharest (RO); Ilie-Ionut Cristea, Bucharest (RO); Armin Satz, Villach (AT); Georg Kaffl, Prutting (DE)

(73) Assignee: Infineon Technologies AG, Neubiberg (DE)

( * ) Notice: Subject to any disclaimer, the term of this patent is extended or adjusted under 35 U.S.C. 154(b) by 279 days.

(21) Appl. No.: 18/510,084

(22) Filed: Nov. 15, 2023

(65) Prior Publication Data

US 2025/0155528 A1 May 15, 2025

(51) Int. Cl.
*G01R 33/07* (2006.01)
*G01R 15/20* (2006.01)

(52) U.S. Cl.
CPC ........... *G01R 33/07* (2013.01); *G01R 15/202* (2013.01)

(58) Field of Classification Search
CPC .... G01R 33/07; G01R 15/202; G01R 33/075; G01R 33/072; G01R 33/077; G01R 15/20; G01R 33/0023; G01D 5/142; G01D 5/145; G01D 5/247; G01B 7/003; H03F 1/0211
USPC ..................................... 324/207.2, 251, 252
See application file for complete search history.

(56) References Cited

U.S. PATENT DOCUMENTS

| | | | | |
|---|---|---|---|---|
| 4,823,075 | A * | 4/1989 | Alley | G01R 15/202 324/99 R |
| 4,833,406 | A * | 5/1989 | Foster | G01R 33/07 324/252 |
| 11,307,267 | B1 * | 4/2022 | Polley | G01R 33/0035 |
| 2016/0293834 | A1 * | 10/2016 | Polley | H10N 52/101 |
| 2020/0393529 | A1 * | 12/2020 | Larson | G01R 33/0082 |
| 2022/0137159 | A1 * | 5/2022 | Al Faruque | G01R 33/007 324/207.2 |
| 2023/0048022 | A1 * | 2/2023 | Parkhurst | G01R 33/072 |

FOREIGN PATENT DOCUMENTS

WO WO-2010014102 A1 * 2/2010 ............ H04L 12/10

* cited by examiner

*Primary Examiner* — Arleen M Vazquez
*Assistant Examiner* — Robert P Alejnikov, Jr.
(74) *Attorney, Agent, or Firm* — Harrity & Harrity, LLP

(57) ABSTRACT

A magnetic field sensor chip includes an input terminal configured to receive an external bias current from an external current source; an internal current generator configured to split the external bias current into a plurality of internal bias currents, including a first internal bias current and a second internal bias current; a Hall sensor configured to be biased by the first internal bias current and set at a first operating point based on the first internal bias current, wherein the Hall sensor is further configured to generate a sensor signal based on a magnetic field and the first operating point; and an amplifier configured to be biased by the second internal bias current and set at a second operating point based on the second internal bias current. The amplifier is configured to amplify the sensor signal into an amplified sensor signal based on the second operating point.

20 Claims, 7 Drawing Sheets

HALL SENSOR SYSTEM BIASED IN CURRENT

BACKGROUND

There are many applications in which measuring an electric current is desired. As one example, it may be desired to measure one or more electric currents of a battery system of an electric vehicle. In another example, it may be desired to measure one or more electric currents provided to a load, such as an electric motor. In yet further examples, it may be desired to measure one or more electric currents of a power distribution system or one or more electric currents in a circuit.

Because an electric current flowing through a current-carrying conductor produces a magnetic field with a magnetic field flux density that is proportional to a magnitude of the electric current, magnetic field sensors can be used as current sensors. By placing a magnetic field sensor near the current-carrying conductor, the magnetic field sensor can generate a measurable quantity, such as a voltage, that is proportional to the magnetic field sensed by the magnetic field sensor. However, the magnetic field flux density in a space around the current-carrying conductor decreases with increasing distance from the current-carrying conductor. Therefore, a sensor element of the magnetic field sensor may be placed in close proximity to the current-carrying conductor.

In addition, a magnetic field sensor may be used to sense a position of an object. As one example, a magnet may be coupled to an object of interest (e.g., a target object). As a result, if the magnetic field sensor is placed in a fixed position, a magnetic field produced by the magnet and sensed at the magnetic field sensor changes as a position of the object changes. For example, a magnetic field flux density of the magnetic field incident on the magnetic field sensor may increase as the object, along with the magnet, moves closer to the magnetic field sensor, and may decrease as the object, along with the magnet, moves farther from the magnetic field sensor. Thus, by placing the magnetic field sensor near a trajectory of the magnet, the magnetic field sensor can generate a measurable quantity, such as a voltage, that is proportional to the position of the object in connection with the magnetic field produced by the magnet.

SUMMARY

In some implementations, a magnetic field sensor chip includes an input terminal configured to receive an external bias current from an external current source; an internal current generator configured to split the external bias current into a plurality of internal bias currents, including a first internal bias current and a second internal bias current; a Hall sensor configured to be biased by the first internal bias current and set at a first operating point based on the first internal bias current, wherein the Hall sensor is further configured to generate a sensor signal based on a magnetic field and the first operating point; and an amplifier configured to be biased by the second internal bias current and set at a second operating point based on the second internal bias current, wherein the amplifier is configured to amplify the sensor signal into an amplified sensor signal based on the second operating point.

In some implementations, a Hall sensor system configured to receive an external bias current from an external current source includes an internal current generator configured to split the external bias current into a plurality of internal bias currents, including a first internal bias current and a second internal bias current; a Hall probe configured to be biased by the first internal bias current and set at a first operating point based on the first internal bias current, wherein the Hall probe is further configured to generate a sensor signal based on a magnetic field and the first operating point; and an amplifier configured to be biased by the second internal bias current and set at a second operating point based on the second internal bias current, wherein the amplifier is configured to amplify the sensor signal into an amplified sensor signal based on the second operating point, wherein the Hall sensor system is integrated on a semiconductor chip.

In some implementations, a method of operating a Hall sensor system integrated on a semiconductor chip includes receiving, by an input terminal, an external bias current from an external current source; splitting, by an internal current generator, the external bias current into a plurality of internal bias currents, including a first internal bias current and a second internal bias current; biasing a Hall sensor with the first internal bias current to set the Hall sensor at a first operating point; generating, by the Hall sensor, a sensor signal based on a magnetic field and the first operating point; biasing an amplifier with the second internal bias current to set the amplifier at a second operating point; and amplifying, by the amplifier, the sensor signal into an amplified sensor signal based on the second operating point.

BRIEF DESCRIPTION OF THE DRAWINGS

Implementations are described herein with reference to the appended drawings.

DETAILED DESCRIPTION

Figure 1:
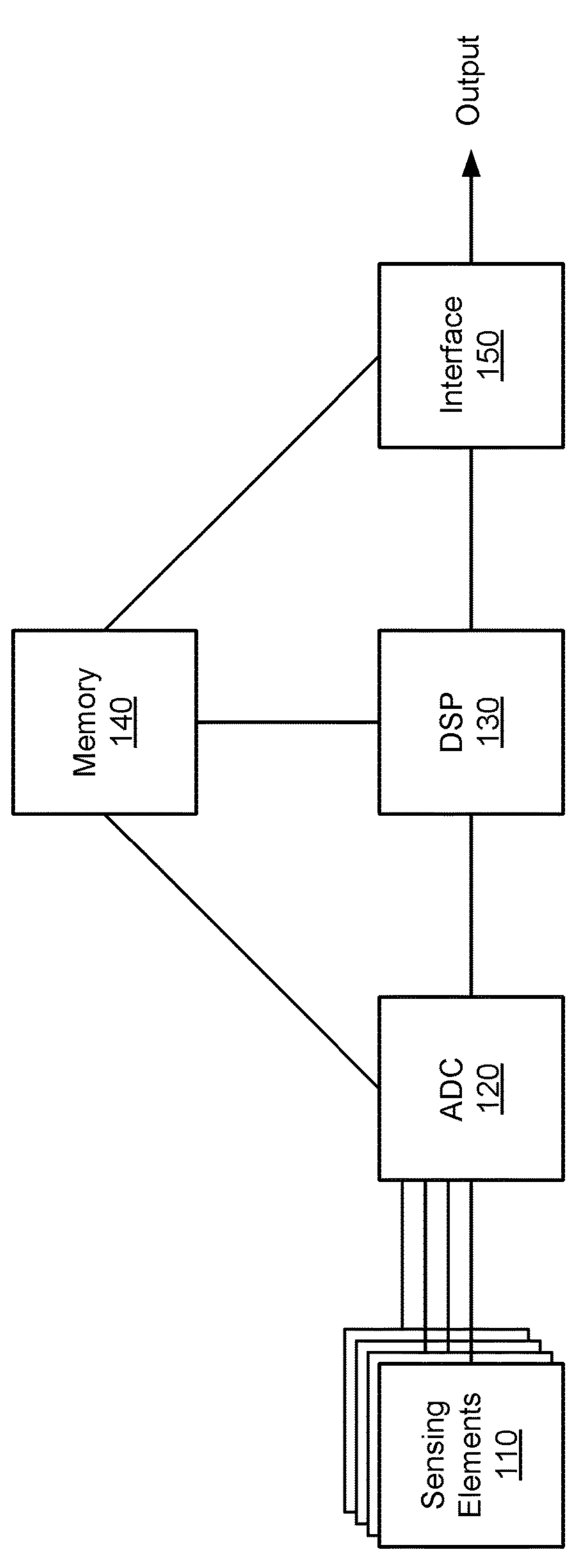
FIG. 1 is a diagram of an example magnetic field sensor according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, there are various sensor techniques for measuring a current flowing through a conductor or a position of an object in connection with a magnetic field, as will be described below. For example, a system may include a current-carrying conductor that carries a current to be measured. A magnetic field sensor may detect a magnetic field created by the current and generate a sensor signal that is proportional to the magnetic field. Thus, the sensor signal may be a measure for the current.

As another example, a system may include a magnet coupled to a movable target object. The magnet may move relative to a magnetic field sensor as the moveable target object moves along a predetermined path. As the magnet moves closer to the magnetic field sensor, a magnetic field produced by the magnet may become more dense (e.g., more concentrated or stronger) in a region of the magnetic field sensor. Conversely, as the magnet moves farther from the magnetic field sensor, the magnetic field may become less dense (e.g., less concentrated or weaker) in the region of the magnetic field sensor. The magnetic field sensor may detect the magnetic field produced by the magnet and generate a sensor signal that is proportional to the magnetic field. Thus, the sensor signal may be a measure for a position of the magnet relative to the magnetic field sensor.

As another example, a magnet may be coupled to a magnetic field sensor as a back-bias magnet. A movable target object may be configured to influence the magnetic field of the back-bias magnet as the moveable target object moves along a predetermined path. For example, the movable target object may be made of a ferromagnetic material. As a result, the magnetic field may become more dense (e.g., more concentrated or stronger) in a region of the magnetic field sensor as the moveable target object moves closer to the back-bias magnet and may become less dense (e.g., less concentrated or weaker) in the region of the magnetic field sensor as the moveable target object moves farther from the back-bias magnet. The magnetic field sensor may detect the magnetic field produced by the back-bias magnet and generate a sensor signal that is proportional to the magnetic field. Thus, the sensor signal may be a measure for a position of the movable target object relative to the magnetic field sensor.

A Hall effect sensor (i.e., a Hall sensor) may be a four-pin device that includes thin piece of semiconductor material, such as doped silicon (Si), gallium arsenide (GaAs), indium antimonide (InSb), indium arsenide (InAs), or metal. A continuous current may be passed from an input current pin to a ground pin, and an output voltage is read out from two output pins. When the Hall sensor is placed within a magnetic field, magnetic flux lines of the magnetic field exert a force on the conductive material which deflects charge carriers (e.g., electrons and holes) to either side of the conductive material. As a result, electrons of the continuous current move in a curved path along the conductor material and a net charge, and therefore the output voltage, develops across the conductive material. The output voltage is representative of a potential difference that is produced between the two output pins as a result of a build-up of the charge carriers at two opposite sides of the conductive material.

The output voltage, called a Hall voltage, is directly proportional to a strength of the magnetic field passing through the conductive material. The output voltage can be quite small (e.g., only a few microvolts even when subjected to strong magnetic fields). As a result, the Hall sensor may include a direct current (DC) amplifier, a logic switching circuit, and a voltage regulator to improve sensitivity, hysteresis, and the output voltage. For example, a Hall sensor may be biased in voltage by an external voltage supply or the voltage regulator in order to achieve a desired operating point (e.g., a desired bias point or quiescent point). Biasing is a setting of a DC operating condition of an electronic component that processes time-varying signals. A Hall sensing element of the Hall sensor may use a steady (e.g., DC) bias voltage across two terminals of the Hall sensing element to operate at the desired operating point. Furthermore, in cases in which increased sensitivity is desired, a Hall sensing element made out of GaAs may be used. However, Hall sensing elements made out of GaAs have disadvantages in linearity and reliability that cannot be compensated by a bias voltage. For example, a high charge carrier mobility in GaAs, InAs, or InSb leads to a smaller saturation limit of a Hall device with GaAs, InAs, or InSb compared to a doped silicon Hall device. As a result, Hall devices with very large input ranges (>500 mT) realized in GaAs, InAs, or InSb can show significant degradation in device linearity for large input fields. As a result, it can be an advantage to use doped silicon Hall devices with integrated signal gain to overcome this limitation of the Hall device with GaAs, InAs, or InSb.

Accordingly, some implementations disclosed herein are directed to a Hall sensor system (e.g., a magnetic field sensor chip) that is biased in current. The Hall sensor system may receive an external bias current from an external current source. The Hall sensor system may include an internal current generator configured to split the external bias current into a plurality of internal bias currents, including a first internal bias current and a second internal bias current. The Hall sensor system may include a Hall probe (e.g., a Hall sensing element) configured to be biased by the first internal bias current and set at a first operating point based on the first internal bias current. The Hall probe may be configured to generate a sensor signal (e.g., a Hall voltage) based on a magnetic field and the first operating point. In addition, the Hall sensor system may include an amplifier configured to be biased by the second internal bias current and set at a second operating point based on the second internal bias current. The amplifier may amplify the sensor signal into an amplified sensor signal based on the second operating point. The internal current generator may regulate the plurality of internal bias currents to individually set the first operating point of the Hall probe and the second operating point of the amplifier. For example, the internal current generator may control a magnitude of the first internal bias current and a magnitude of the second internal bias current independent of the external current source, where a sum of the magnitude of the first internal bias current and the magnitude of the second internal bias current is less than a magnitude of the external bias current.

FIG. 1 is a diagram of an example magnetic field sensor 100 according to one or more implementations. As shown in FIG. 1, the magnetic field sensor 100 may include one or more sensing elements 110 (e.g., one or more magnetic field sensing elements), an analog-to-digital convertor (ADC) 120, a digital signal processor (DSP) 130, a memory element 140, and an interface 150.

The magnetic field sensor 100 may be a semiconductor chip (e.g., a sensor chip) that includes the one or more sensing elements 110 that measure or otherwise sense one or more characteristics of a magnetic field (e.g., an amount of magnetic field flux density, a field strength, a field angle, a field direction, a field orientation, etc.) and provide a sensor signal corresponding to the sensed characteristics of the magnetic field. For example, a sensing element 110 may be configured to generate a sensor signal (e.g., a voltage) in response to one or more magnetic fields impinging on the sensing element 110. Thus, the sensor signal is indicative of a magnitude and/or a field orientation of at least one magnetic field impinging on the sensing element 110. The semiconductor chip may further include sensor circuitry for processing and outputting one or more sensor signals generated by the one or more sensing elements 110. In some implementations, the sensing elements 110 may be distributed on two or more semiconductor chips.

The magnetic field may be produced by a magnet, a current-carrying conductor (e.g., a wire, a lead frame, or a busbar), the Earth, or another magnetic field source. A sensing element 110 has a "sensitivity axis" or "sensing axis." The sensing element is sensitive to a magnetic field component of a magnetic field that is projected onto or aligned with the sensitivity axis. Moreover, a sensing element 110 is substantially insensitive to magnetic field components of a magnetic field that are not projected onto or aligned with the sensitivity axis. A magnetic field component may be, for example, an x-magnetic field component Bx, a y-magnetic field component By, or a z-magnetic field component Bz. In the examples described herein, the x-magnetic field component Bx and the y-magnetic field component By are aligned in-plane to the semiconductor chip, and the z-magnetic field component Bz is aligned out-of-plane to the semiconductor chip. Accordingly, the x-magnetic field component Bx and the y-magnetic field component By may be referred to as "in-plane" magnetic field components that are aligned parallel to a chip plane (e.g., a chip surface) of the semiconductor chip. In contrast, the z-magnetic field component Bz may be referred to as an "out-of-plane" magnetic field component that extends out of the chip plane (e.g., a chip surface) of the semiconductor chip. For example, the z-magnetic field component Bz extends perpendicular to the chip plane.

In some implementations, the magnetic field sensor 100 includes multiple sensing elements 110 that are sensitive in two or more different directions. For example, the magnetic field sensor 100 may include a first sensing element configured to sense a first magnetic field component (e.g., the x-magnetic field component Bx), a second sensing element configured to sense a second magnetic field component (e.g., the y-magnetic field component By), and a third sensing element configured to sense a third magnetic field component (e.g., the z-magnetic field component Bz). That is, in some implementations, the magnetic field sensor 100 may be a 2D magnetic field sensor or a 3D magnetic field sensor that is configured to sense the magnetic field in multiple dimensions.

The sensing elements 110 may include one or more Hall-based sensing elements (i.e., Hall sensing elements). A Hall sensing element is a transducer that varies an output voltage (e.g., a Hall voltage) in response to a magnetic field. The Hall sensing element may be, for example, a Hall plate through which a current is conducted. The output voltage of the Hall sensing element is based on a Hall effect which makes use of a Lorentz force. The Lorentz force deflects moving charges in a presence of the magnetic field, which is perpendicular to a current flow through the Hall sensing element (e.g., a Hall plate). Thereby, the Hall sensing element can be a thin piece of semiconductor material or metal. The deflection causes a charge separation, which causes a Hall electrical field. This Hall electrical field acts on the charge in an opposite direction to the Lorentz force. Both forces balance each other and create a potential difference perpendicular to a direction of current flow. The potential difference can be measured as the Hall voltage and varies in a linear relationship with the magnetic field.

Two or more sensing elements and corresponding sensor circuitry may be accommodated (e.g., integrated) in a same semiconductor chip. The sensor circuitry may be referred to as signal processing circuitry and/or signal conditioning circuitry that receives one or more signals (e.g., sensor signals) from one or more sensing elements in the form of raw measurement data, and derives, from the one or more signals, a measurement signal that represents the magnetic field. For example, the sensor circuitry may be configured to condition and amplify the sensor signal of one or more sensing elements 110 via signal processing and/or conditioning. In some implementations, the sensor circuitry may be configured to combine two or more sensor signals (e.g., by addition, subtraction, or superimposition) to generate a combined sensor signal. For example, a differential sensor signal is one type of combined sensor signal that is representative of a difference between two sensor signals.

The ADC 120 may include an analog-to-digital converter that converts an analog signal from one or more sensing elements 110 to a digital signal. For example, the ADC 120 may convert analog signals, received from the set of sensing elements 110, into digital signals (e.g., digital samples) to be processed by DSP 130. The ADC 120 may provide the digital signals to DSP 130. In some implementations, magnetic field sensor 100 may include one or more ADCs 120. For example, different ADCs 120 may be configured to receive analog signals from different sets of sensing elements 110.

The DSP 130 may include a digital signal processing device or a collection of digital signal processing devices. In some implementations, the DSP 130 may receive digital signals from the ADC 120 and may process the digital signals to form output signals (e.g., destined for a controller), such as an output signal that conveys sensor data, as described elsewhere herein. In some implementations, the output signals may be referred to as measurement signals.

The memory element 140 may include a read-only memory (ROM) (e.g., an EEPROM), a random-access memory (RAM), and/or another type of dynamic or static storage device (e.g., a flash memory, a magnetic memory, an optical memory, etc.) that stores information and/or instructions for use by magnetic field sensor 100. In some implementations, the memory element 140 may store information associated with processing performed by DSP 130. Additionally, or alternatively, the memory element 140 may store configurational values or parameters for the one or more sensing elements 110 and/or information for one or more other components of magnetic field sensor 100, such as the ADC 120 or the interface 150.

The interface 150 may include an interface via which magnetic field sensor 100 may receive and/or provide information from and/or to another device in a system, such as a controller. For example, the interface 150 may provide the output signal, determined or otherwise generated by DSP 130, to the controller, and may further receive information from the controller. In some implementations, the interface 150 may be a communication interface that receives the output signals from the DSP 130 and provides the output signals as communication signals according to a communication protocol, which may include transmitting the output signals as the communication signals or generating the communication signals based on the output signals.

As indicated above, FIG. 1 is provided as an example. Other examples may differ from what is described with regard to FIG. 1. The number and arrangement of components shown in FIG. 1 are provided as an example. In practice, the magnetic field sensor 100 may include additional components, fewer components, different components, or differently arranged components than those shown in FIG. 1. Two or more components shown in FIG. 1 may be implemented within a single component, or a single component shown in FIG. 1 may be implemented as multiple, distributed components. Additionally, or alternatively, a set of components (e.g., one or more components) of the magnetic field sensor 100 may perform one or more functions described as being performed by another set of components of the magnetic field sensor 100.

Figure 2:
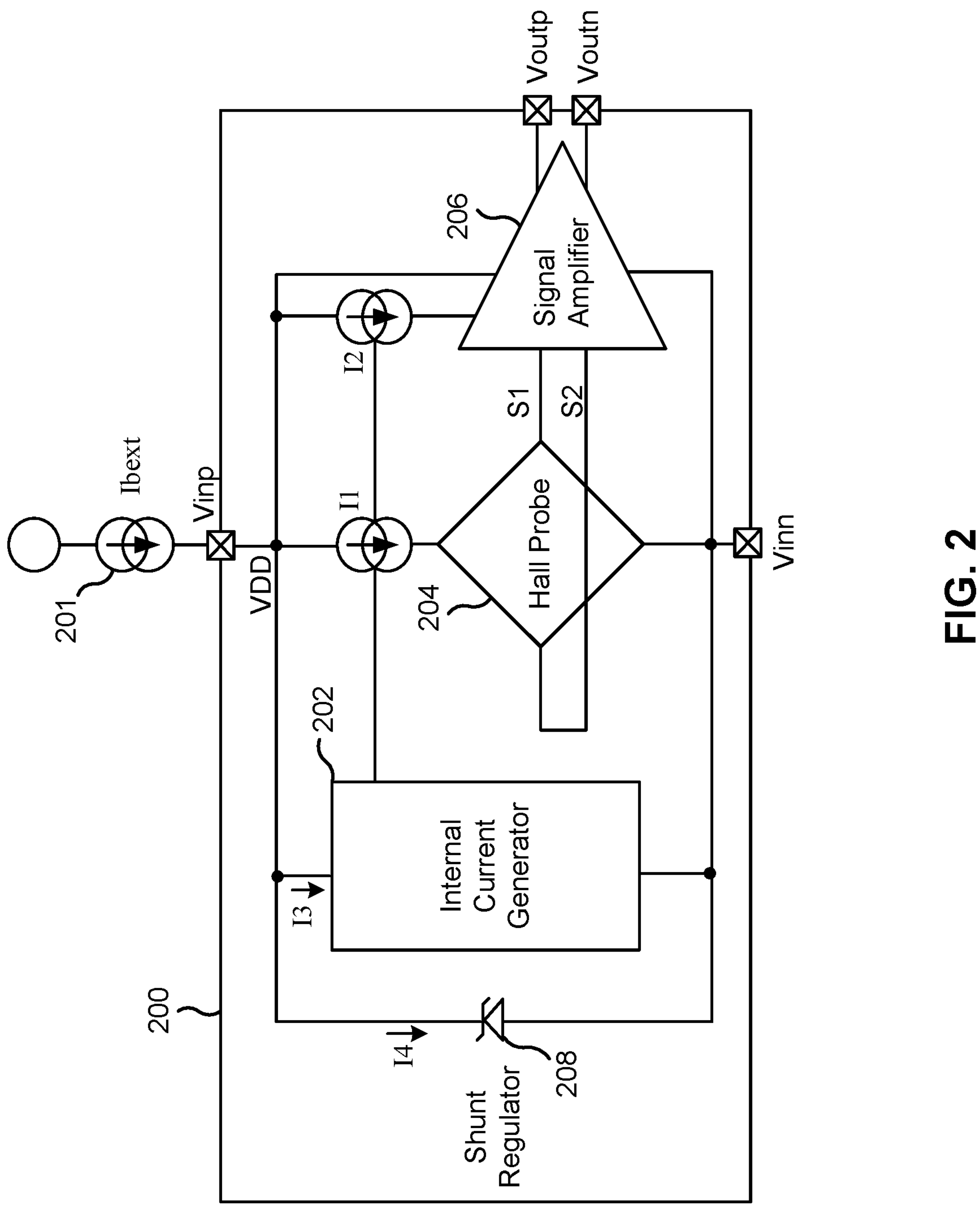
FIG. 2 illustrates a magnetic field sensor chip according to one or more implementations.

FIG. 2 illustrates a magnetic field sensor chip 200 according to one or more implementations. The magnetic field sensor chip 200 may be a semiconductor chip and may include a first supply terminal Vinp, a second supply terminal Vinn, a first output terminal Voutp, and a second output terminal Voutn. The first supply terminal Vinp may be configured to receive an external bias current Ibext from an external current source 201. Thus, the first supply terminal Vinp may be an input terminal for receiving the external bias current Ibext.

The magnetic field sensor chip 200 may include an internal current generator 202 configured to split the external bias current Ibext into a plurality of internal bias currents, including a first internal bias current I1 and a second internal bias current I2. Additional internal bias currents may be generated by the internal current generator 202 depending on a need for additional current biasing within the magnetic field sensor chip 200. The plurality of internal bias currents may be generated in parallel as parallel currents. The internal current generator 202 may be implemented by analog circuitry (e.g., current mirror circuitry) and/or digital circuitry. For example, the internal current generator 202 may include a current mirror for each internal bias current that is generated.

The magnetic field sensor chip 200 may include a Hall sensor 204 configured to be biased by the first internal bias current I1 and set at a first operating point based on the first internal bias current I1. The Hall sensor 204 may be configured to generate a sensor signal (e.g., a Hall voltage) based on a magnetic field and the first operating point. The Hall sensor 204 may be a Hall probe (e.g., Hall sensing element) that includes four terminals, including two supply terminals and two output terminals. The first internal bias current I1 is injected across the two supply terminals and a potential difference may be measured as the Hall voltage across the two output terminals. The first operating point may correspond to a magnetic field sensitivity and/or a linearity of the Hall probe. Thus, the first internal bias current I1 may be used to configure the magnetic field sensitivity and/or the linearity of the Hall sensor 204.

In some implementations, the Hall sensor 204 may include two or more Hall probes (e.g., two or more Hall sensing elements), with each Hall probe receiving a corresponding internal bias current or a portion of the first internal bias current I1.

The magnetic field sensor chip 200 may include an amplifier 206 (e.g., a signal amplifier) configured to be biased by the second internal bias current I2 and set at a second operating point based on the second internal bias current I2. The amplifier 206 may be configured to amplify the sensor signal into an amplified sensor signal based on the second operating point. Since the sensor signal may be representative of the potential difference across the two output terminals of the Hall sensor 204, the sensor signal may be a differential signal that includes a first sensor signal S1 provided by a first output of the Hall sensor 204 and a second sensor signal S2 provided by a second output of the Hall sensor 204. The potential difference may be a measure of a difference between the first sensor signal S1 and the second sensor signal S2. Accordingly, the amplifier 206 may be configured to amplify the first sensor signal S1 into a first amplified sensor signal based on the second operating point and amplify the second sensor signal S2 into a second amplified sensor signal based on the second operating point. The first amplified sensor signal and the second amplified sensor signal may be provided to the first output terminal Voutp and the second output terminal Voutn, respectively.

The second operating point may be configured to maintain the amplifier 206 in an active region (e.g., a linear region). For example, the amplifier 206 may include one or more transferred used for amplifying signals. The second internal bias current I2 may be used to bias the amplifier 206 so that the second operating point is at a center of a linear part of the transistors' characteristic curves (e.g., the second operation point may be set at a midpoint of a linear portion of a characteristic curve). Said differently, the amplifier 206 may be biased such that the transistors of the amplifier 206 are operated in the active region of a respective characteristic curve.

The internal current generator 202 may control a magnitude of the first internal bias current I1 and a magnitude of the second internal bias current I2 independent of the external current source 201. A sum of the magnitude of the first internal bias current I1 and the magnitude of the second internal bias current I2 is less than a magnitude of the external bias current Ibext. The internal current generator 202 may regulate the magnitude of the first internal bias current I1 and the magnitude of the second internal bias current I2 based on desired operating points for the first operating point and the second operating point, respectively. For example, the internal current generator 202 may adjust the magnitude of the first internal bias current I1 to set the first operating point at a desired first set point, and may adjust the magnitude of the second internal bias current I2 to set the second operating point at a desired second set point. The internal current generator 202 may set the magnitude of the first internal bias current I1 and the magnitude of the second internal bias current I2 independently of each other, with a condition that the sum of the magnitude of the first internal bias current I1 and the magnitude of the second internal bias current I2 is less than the magnitude of the external bias current Ibext. Thus, the internal current generator 202 may control an amount of the first bias current I1 provided to the Hall probe and an amount of the second bias current I2 provided to the amplifier 206 independent of the external current source 201, with a condition that a sum of the plurality of internal bias currents is less than the external bias current Ibext.

In some implementations, the magnetic field sensor chip 200 may include a shunt regulator 208 that may generate an internal supply voltage VDD with a constant voltage level and provide the internal supply voltage to internal components of the magnetic field sensor chip 200, including the internal current generator 202, the Hall sensor 204, and the amplifier 206. Thus, the shunt regulator 208 may function as a clamp that clamps the internal supply voltage VDD to the constant voltage level. The shunt regulator 208 may be connected in parallel with the internal current generator 202, the Hall sensor 204, and the amplifier 206 to provide the internal supply voltage VDD to each internal component.

The shunt regulator 208 may generate the internal supply voltage VDD based on the external bias current Ibext. The internal supply voltage VDD may be used by the internal components of the magnetic field sensor chip 200 for normal operation. In some implementations, the internal supply voltage VDD may be used to generate operational currents for the internal components. For example, the internal supply voltage VDD may be used to generate an operational current for the Hall sensor 204 that may be injected across the two supply terminals of the Hall probe in addition to the first internal bias current I1.

In some implementations, the internal current generator 202 may consume a small portion (e.g., 0.1 mA) of the external bias current Ibext for operation. Thus, the internal current generator 202 may receive current I3 for operation.

The shunt regulator 208 may be configured to sink an excess current I4 of the external bias current Ibext. The excess current I4 may be a remaining portion of the external bias current Ibext that is not split into the plurality of internal bias currents (e.g., the first internal bias current I1 and the second internal bias current I2) or used by the internal current generator 202. The internal current generator 202, the Hall sensor 204, the amplifier 206, and the shunt regulator 208 may form a Hall sensor system that is integrated on the magnetic field sensor chip 200.

As indicated above, FIG. 2 is provided as an example. Other examples may differ from what is described with regard to FIG. 2. The number and arrangement of components shown in FIG. 2 are provided as an example. In practice, the magnetic field sensor chip 200 may include additional components, fewer components, different components, or differently arranged components than those shown in FIG. 2. Two or more components shown in FIG. 2 may be implemented within a single component, or a single component shown in FIG. 2 may be implemented as multiple, distributed components. Additionally, or alternatively, a set of components (e.g., one or more components) of the magnetic field sensor chip 200 may perform one or more functions described as being performed by another set of components of the magnetic field sensor chip 200.

Figure 3:
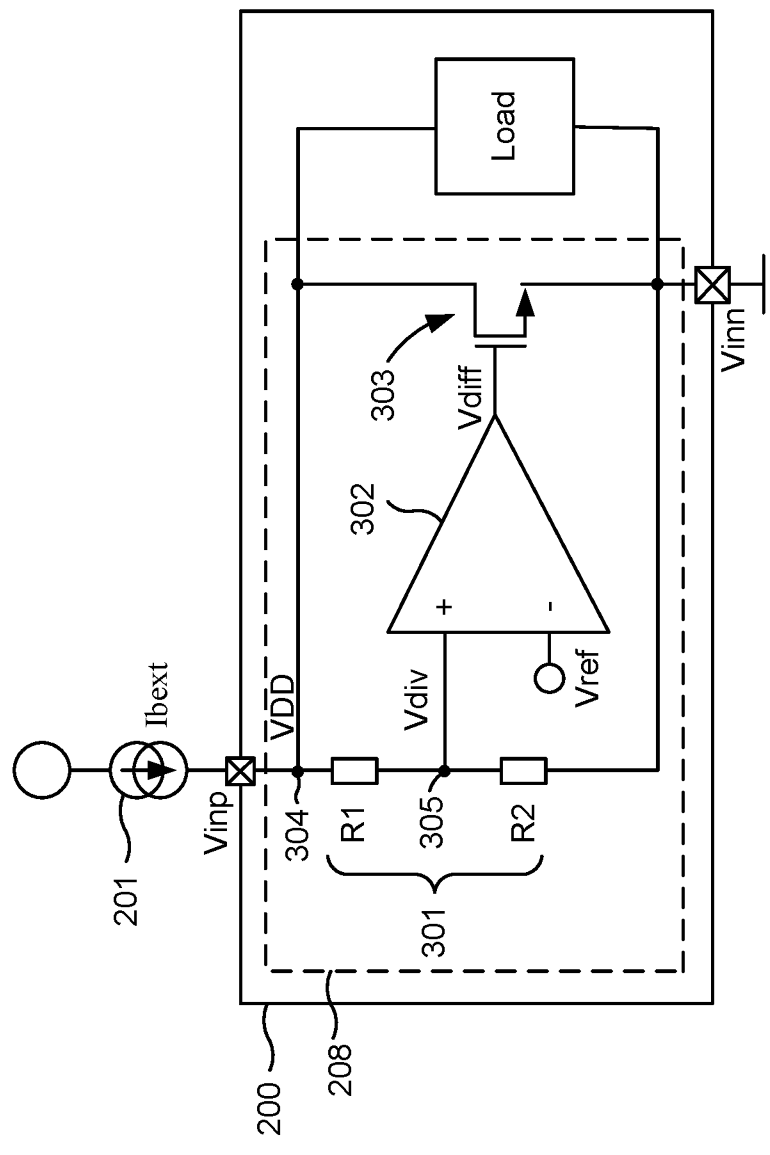
FIG. 3 illustrates aspects of the magnetic field sensor chip of FIG. 2 in more detail according to one or more implementations.

FIG. 3 illustrates the magnetic field sensor chip 200 according to one or more implementations. In particular, FIG. 3 shows the shunt regulator 208 in more detail. The shunt regulator 208 may include a resistive voltage divider 301, a differential amplifier 302, and a pass transistor 303 coupled in parallel to the resistive voltage divider 301. The pass transistor 303 may also be coupled in parallel to a load of the magnetic field sensor chip 200. The load may be representative of the internal current generator 202, the Hall sensor 204, and/or the amplifier 206.

The resistive voltage divider 301 may include a first resistive element R1 (e.g., a first resistor) and a second resistive element R2 (e.g., a second resistor). Resistive values or resistances of the first resistive element R1 and the second resistive element R2 may be equal (e.g., 1 megaohm). The resistive voltage divider 301 may receive a portion of the external bias current Ibext at a divider input node 304 and provide an output voltage Vdiv at a divider output node 305 based on the resistances of the first resistive element R1 and the second resistive element R2. In addition, the resistive voltage divider 301 may generate the internal supply voltage VDD at the divider input node 304 based on the external bias current Ibext and the resistances of the first resistive element R1 and the second resistive element R2.

The differential amplifier 302 may include a non-inverting input coupled to the divider output node 305, an inverting input coupled to a reference voltage supply that provides a reference voltage Vref, and a differential amplifier output coupled to a control terminal of the pass transistor 303. In some implementations, the reference voltage Vref may be a bandgap reference voltage that is generated by a bandgap reference circuit of the magnetic field sensor chip 200. The differential amplifier 302 may generate an output voltage Vdiff at the differential amplifier output that is based on a difference between the output voltage Vdiv at the divider output node 305 and the reference voltage Vref. In some implementations, the output voltage Vdiff may be equal to the difference between the output voltage Vdiv at the divider output node 305 and the reference voltage Vref.

The control terminal of the pass transistor 303 may be a gate electrode. Thus, the output voltage Vdiff may be used as a control signal to control a conduction state (or blocking state) of the pass transistor 303. The pass transistor 303 may be configured to sink the excess current I4, or at least a portion of the excess current I4 of the external bias current Ibext, based on the output voltage Vdiff. As a result, any excess current of the external bias current Ibext not used by the internal current generator 202, the Hall sensor 204, or the amplifier 206 may be sinked and/or consumed by the shunt regulator 208.

As indicated above, FIG. 3 is provided as an example. Other examples may differ from what is described with regard to FIG. 3.

Figure 4:
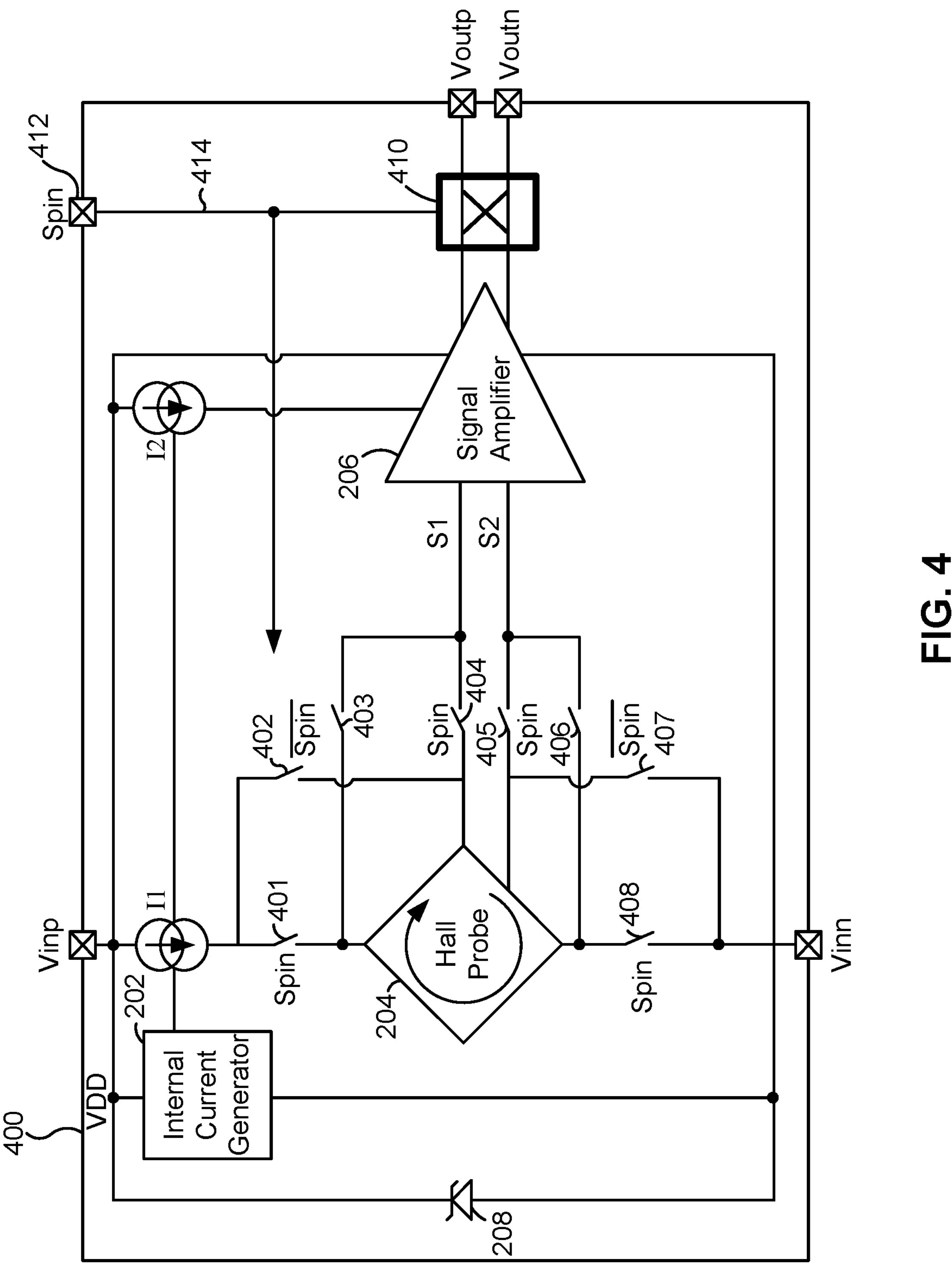
FIG. 4 illustrates a magnetic field sensor chip according to one or more implementations.

FIG. 4 illustrates a magnetic field sensor chip 400 according to one or more implementations. The magnetic field sensor chip 400 may include the internal current generator 202, the Hall sensor 204, the amplifier 206, and the shunt regulator 208, as similarly described in connection with FIGS. 2 and 3. In addition, the magnetic field sensor chip 400 may include a plurality of switches 401-408 coupled to the Hall sensor 204 (e.g., coupled to the four terminals of the Hall probe).

The plurality of switches 401-408 may be operated based on a spinning current scheme during which a path of the first bias current I1 may be constantly changed for each subsequent readout of the Hall sensor 204. For example, the two supply terminals of the Hall sensor 204 may be rotated in a clockwise or counterclockwise manner by controlling the plurality of switches 401-408. Similarly, the two output terminals of the Hall sensor 204 may be rotated in a clockwise or counterclockwise manner by controlling the plurality of switches 401-408. Thus, the plurality of switches 401-408 may provide the first internal bias current I1 to the Hall sensor 204 based on the spinning current scheme, and may output the sensor signal (e.g., the sensor signals S1 and S2) based on the spinning current scheme.

The spinning current scheme may be used to modulate an offset component (or offset-related components) of the sensor signal (e.g., of the sensor signals S1 and S2) to a different frequency band that is outside of a frequency band of the sensor signal. A net result of the spinning current scheme is that the offset component and a useful signal component (e.g., a component of interest) of the sensor signal are separated in frequency at an output of the Hall sensor 204. In other words, the offset component (or offset-related components) and the useful signal component of the sensor signal are separated in frequency at an input of the amplifier 206. Suppression of the offset component may be performed by means of filtering, chopping, or an offset reduction loop (ORL).

The magnetic field sensor chip 400 may further include a demodulator circuit 410 coupled to an output of the amplifier 206. The demodulator circuit 410 may be configured to facilitate a removal of an offset outside the magnetic field sensor chip 400. For example, the demodulator circuit 410 may demodulate a first amplified sensor signal and a second amplified sensor signal into respective DC signals. For example, the demodulator circuit 410 may be a chopper circuit.

The magnetic field sensor chip 400 may further include an external control terminal 412 configured to receive a control signal 414 for controlling the plurality of switches 401-408 to implement the spinning current scheme. In addition, the chopper circuit may receive the amplified sensor signal (e.g., amplified signals of the sensor signals S1 and S2) and the control signal 414, and demodulate the amplified sensor signal to DC based on the control signal 414. For example, a frequency of the control signal 414 may be used for controlling a chopping frequency of the chopper circuit.

As noted above, the sensor signal may be a differential signal comprising the first sensor signal S1 provided by a first output of the Hall sensor 204 and the second sensor signal S2 provided by a second output of the Hall sensor. The amplifier 206 may be configured to amplify the first sensor signal S1 into the first amplified sensor signal based on the second operating point and amplify the second sensor signal S2 into the second amplified sensor signal based on the second operating point. In addition, the demodulator circuit 410 may be configured to receive the first amplified sensor signal, the second amplified sensor signal, and the control signal 414, and demodulate the first amplified sensor signal and the second amplified sensor signal into DC signals based on the control signal 414. As a result, offset components of the first amplified sensor signal and the second amplified sensor signal may be suppressed outside the magnetic field sensor chip 400 by an external signal processing device that is configured to process output signals received from the first output terminal Voutp and the second output terminal Voutn, respectively.

As indicated above, FIG. 4 is provided as an example. Other examples may differ from what is described with regard to FIG. 4.

Figure 5:
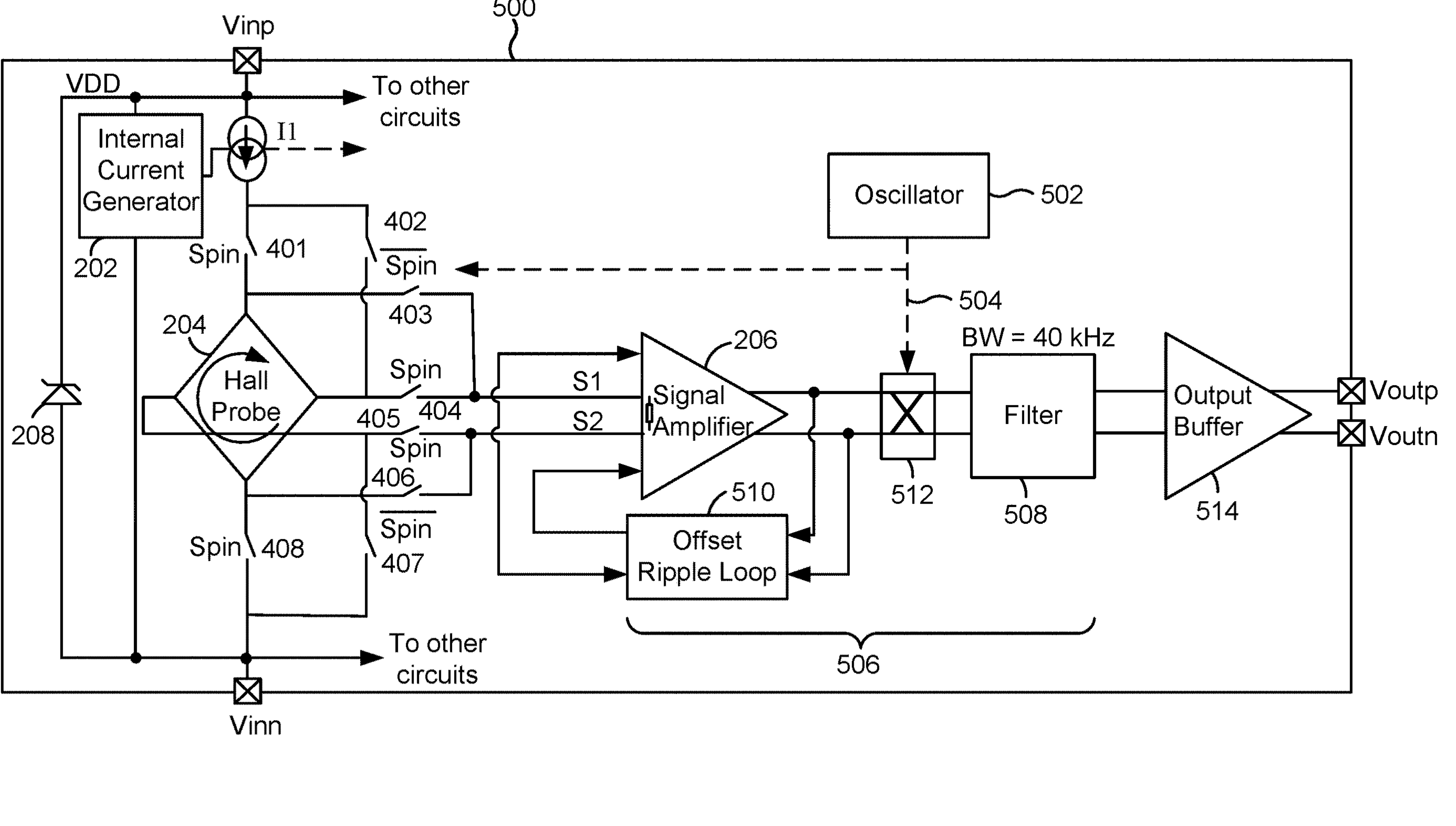
FIG. 5 illustrates a magnetic field sensor chip according to one or more implementations.

FIG. 5 illustrates a magnetic field sensor chip 500 according to one or more implementations. The magnetic field sensor chip 500 may include the internal current generator 202, the Hall sensor 204, the amplifier 206, and the shunt regulator 208, as similarly described in connection with FIGS. 2 and 3. In addition, the magnetic field sensor chip 500 includes the plurality of switches 401-408 coupled to the Hall sensor 204 (e.g., coupled to the four terminals of the Hall probe), as similarly described in connection with FIG. 4.

In addition, the magnetic field sensor chip 500 may include an internal oscillator 502 configured to generate an oscillator signal 504 for controlling the plurality of switches 401-408 to implement a spinning current scheme. The spinning current scheme may modulate an offset component of the sensor signal to a different frequency band outside of a frequency band of the sensor signal, as similarly described in connection with FIG. 4. The magnetic field sensor chip 400 may also include an offset removal circuit 506 coupled to an output of the amplifier 206. The offset removal circuit 506 may be configured to remove or otherwise suppress one or more offset components from the amplified sensor signal (e.g., from the first amplified sensor signal and the second amplified sensor signal).

The offset removal circuit 506 may include a filter 508 configured to remove signal components of the amplified sensor signal located in the different frequency band, including the offset components, to generate a filtered sensor signal. The filter 508 may be configured to pass the useful signal components. In some implementations, the filter 508 may have bandwidth (BW) of about 40 kHz.

Additionally, or alternatively, the offset removal circuit 506 may include an offset ripple loop 510 coupled as a feedback loop between an output of the amplifier 206 (e.g., the outputs of the amplifier 206) and an input of the amplifier 206 (e.g., the inputs of the amplifier 206). The offset ripple loop 510 may be an ORL. The offset components may be rejected by the offset ripple loop 510.

Additionally, or alternatively, the offset removal circuit 506 may include a demodulator 512 (e.g., a chopper circuit) configured to receive the amplified sensor signal and the oscillator signal 504, and may demodulate the amplified sensor signal into a DC signal based on the oscillator signal 504. The demodulator 512 may use a frequency of the oscillator signal 504 as a chopping frequency. Thus, the demodulator 512 may demodulate the first amplified sensor signal and the second amplified sensor signal into DC signals based on the frequency of the oscillator signal 504.

Accordingly, the offset removal circuit 506 may include any combination of filters, offset ripple loops (including feeding back at the amplifier level), chopper circuits, and/or switched capacitor techniques to suppress offset ripple, chopping/spinning artefacts, and/or any other offset-related signal components. The offset removal circuit 506 may use the oscillator signal 504 to perform demodulation to aid in suppressing the offset components. As a result, the offset components of the first amplified sensor signal and the second amplified sensor signal may be suppressed by the offset removal circuit 506, and the useful signal components of the first amplified sensor signal and the second amplified sensor signal may be output by the first output terminal Voutp and the second output terminal Voutn, respectively.

In some implementations, the filter 508 may be a high ohmic filter (e.g., hundreds of kiloohms or greater). Thus, the magnetic field sensor chip 500 may include an output buffer 514 that may be configured to receive the filtered sensor signal from the filter 508 (e.g., filtered sensor signals of S1 and S2), and provide a low ohmic output that has a lower impedance than the filter 508 by at least a factor of 10. In some implementations, the low ohmic output may have a lower impedance than the filter 508 by at least a factor of 100. For example, the output buffer 514 may have an impedance of about 1-10 kiloohms. The output buffer 514 may output the filtered sensor signal (e.g., filtered sensor signals of S1 and S2) to the first output terminal Voutp and the second output terminal Voutn, respectively.

As indicated above, FIG. 5 is provided as an example. Other examples may differ from what is described with regard to FIG. 5.

Figure 6:
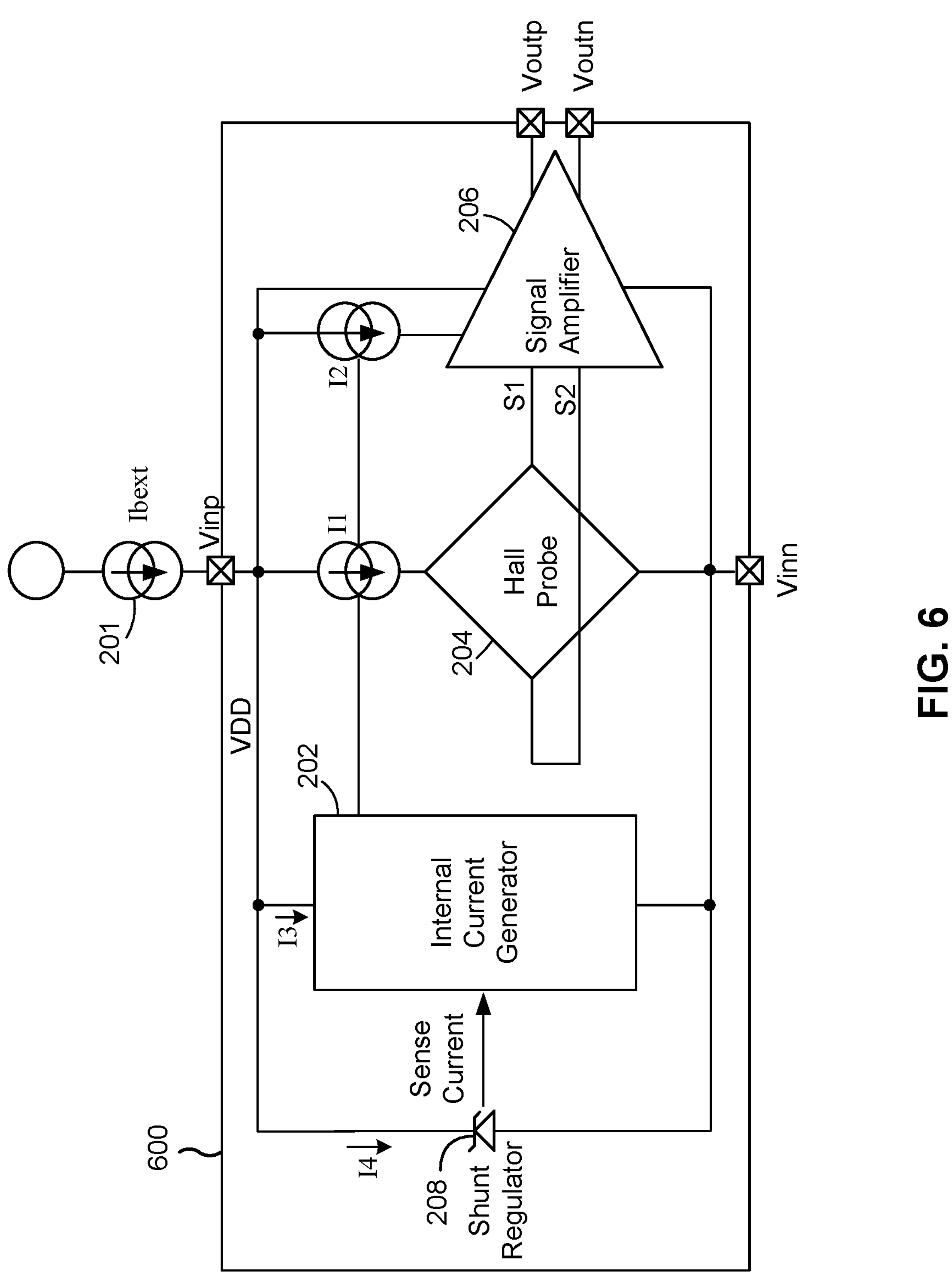
FIG. 6 illustrates a magnetic field sensor chip according to one or more implementations.

FIG. 6 illustrates a magnetic field sensor chip 600 according to one or more implementations. The magnetic field sensor chip 600 may include the internal current generator 202, the Hall sensor 204, the amplifier 206, and the shunt regulator 208, as similarly described in connection with FIGS. 2 and 3. In addition, the shunt regulator 208 may include a current sense feature used to control the internal current generator 202. For example, the shunt regulator 208 may sense or measure the excess current I4, and, if the excess current I4 is higher than a threshold, the shunt regulator 208 may trigger the internal current generator 202 to provide more internal bias current to the Hall sensor 204 and/or the amplifier 206.

In some implementations, the shunt regulator 208 may include a current sense function configured to measure the excess current, and a comparator circuit configured to generate a bias control signal based on the excess current I4 satisfying the threshold and provide the bias control signal to the internal current generator 202. The internal current generator 202 may be configured to increase at least one of the plurality of internal bias currents (e.g., the first internal bias current I1 and/or the second internal bias current I2) based on the bias control signal. For example, the internal current generator 202 may adjust a variable resistor, a gate control signal, or a programmable current source to increase at least one of the plurality of internal bias currents. If the shunt regulator 208 determines that the excess current I4 no longer satisfies the threshold, the shunt regulator 208 may generate a bias control signal that triggers the internal current generator 202 to decrease the internal bias current that was previously increased.

The current sensor may be configured to sense the excess current through the resistive voltage divider 301 and/or the pass transistor 303. The internal current generator 202 may include control circuitry that is configured to adjust (e.g., increase) at least one of the plurality of internal bias currents when the bias control signal indicates that the excess current I4 satisfies the threshold.

As indicated above, FIG. 6 is provided as an example. Other examples may differ from what is described with regard to FIG. 6.

Figure 7:
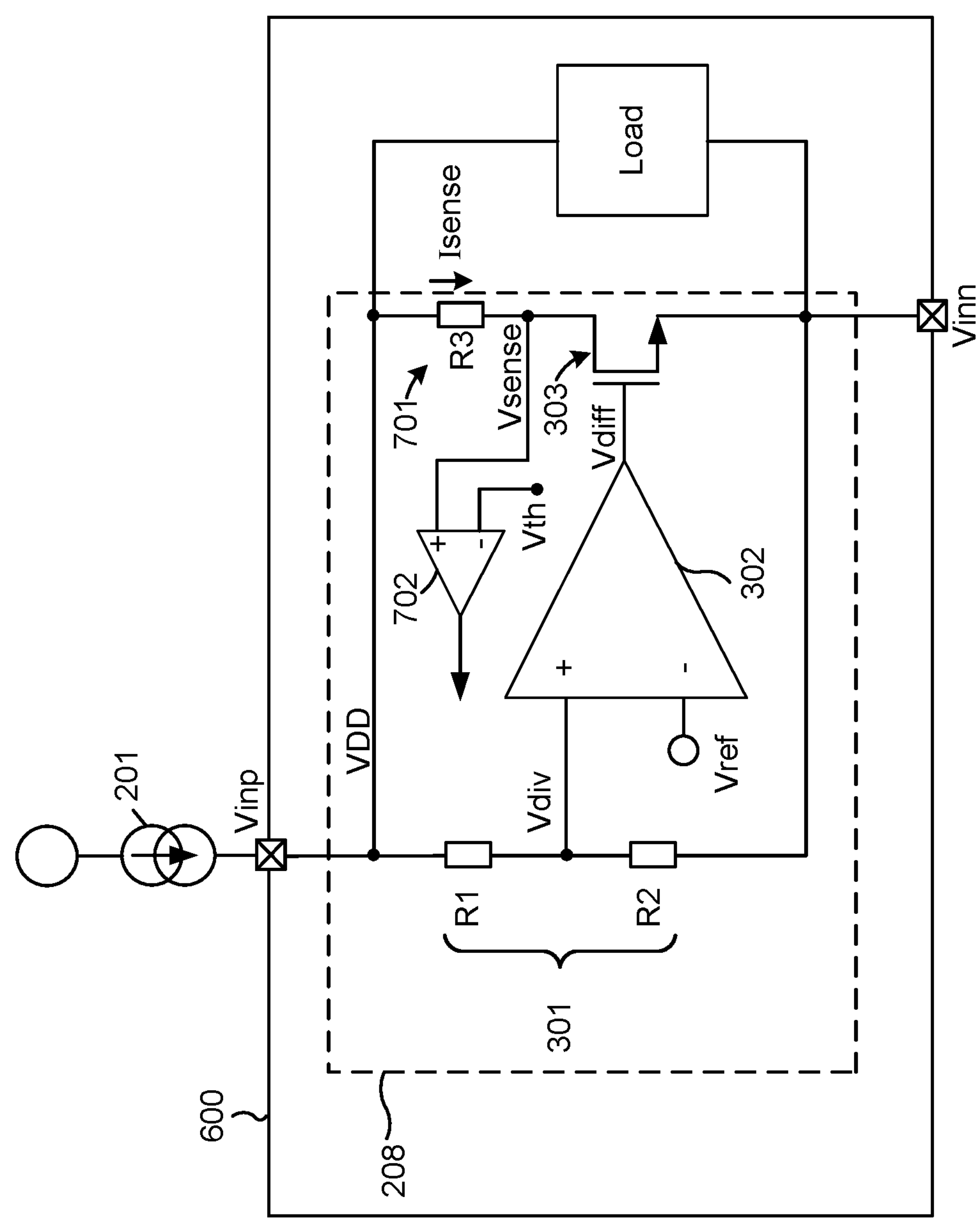
FIG. 7 illustrates aspects of the magnetic field sensor chip of FIG. 6 in more detail according to one or more implementations.

FIG. 7 illustrates the magnetic field sensor chip 600 according to one or more implementations. In particular, FIG. 7 shows the shunt regulator 208 with the current sense function shown in more detail. The shunt regulator 208 may include a current sensor 701, which may be implemented as a sense resistor R3 arranged in series with the pass transistor 303. A sense voltage Vsense representative of a sense current Isense (e.g., an excess current) that flows through the pass transistor 303 may be generated at a node that is arranged between the sense resistor R3 and the pass transistor 303. A comparator 702 may receive the sense voltage Vsense and a threshold voltage Vth, and trigger first bias control signal when the sense voltage Vsense satisfies the threshold voltage Vth (e.g., when the sense voltage Vsense is greater than the threshold voltage Vth).

The comparator 702 may provide the first bias control signal to the internal current generator. The internal current generator may be configured to increase at least one of the plurality of internal bias currents (e.g., the first internal bias current I1 and/or the second internal bias current I2) based on the first bias control signal indicating that the sense voltage Vsense satisfies the voltage threshold Vth (e.g., the excess current I4 satisfies a corresponding threshold).

If the comparator 702 determines that the sense voltage Vsense no longer satisfies the voltage threshold Vth, the comparator 702 may generate a second bias control signal that triggers the internal current generator to decrease the internal bias current that was previously increased in response to the first bias control signal. The first and the second bias control signals may be a same signal, but with different signal values or signal value ranges.

As indicated above, FIG. 7 is provided as an example. Other examples may differ from what is described with regard to FIG. 7.

The following provides an overview of some Aspects of the present disclosure:

Aspect 1: A magnetic field sensor chip, comprising: an input terminal configured to receive an external bias current from an external current source; an internal current generator configured to split the external bias current into a plurality of internal bias currents, including a first internal bias current and a second internal bias current; a Hall sensor configured to be biased by the first internal bias current and set at a first operating point based on the first internal bias current, wherein the Hall sensor is further configured to generate a sensor signal based on a magnetic field and the first operating point; and an amplifier configured to be biased by the second internal bias current and set at a second operating point based on the second internal bias current, wherein the amplifier is configured to amplify the sensor signal into an amplified sensor signal based on the second operating point.

Aspect 2: The magnetic field sensor chip of Aspect 1, wherein the first operating point is a magnetic field sensitivity, and wherein the second operating point is configured to maintain the amplifier in an active region.

Aspect 3: The magnetic field sensor chip of any of Aspects 1-2, wherein the internal current generator is configured to control a magnitude of the first internal bias current and a magnitude of the second internal bias current independent of the external current source, and wherein a sum of the magnitude of the first internal bias current and the magnitude of the second internal bias current is less than a magnitude of the external bias current.

Aspect 4: The magnetic field sensor chip of any of Aspects 1-3, further comprising: a shunt regulator configured to generate an internal supply voltage with a constant voltage level and provide the internal supply voltage to the internal current generator, the Hall sensor, and the amplifier.

Aspect 5: The magnetic field sensor chip of Aspect 4, wherein the shunt regulator is configured to generate the internal supply voltage based on the external bias current.

Aspect 6: The magnetic field sensor chip of Aspect 4, wherein the shunt regulator is configured to sink an excess current of the external bias current, and wherein the excess current is a remaining portion of the external bias current that is not split into the plurality of internal bias currents.

Aspect 7: The magnetic field sensor chip of Aspect 6, wherein the shunt regulator includes: a current sensor configured to measure the excess current; and a comparator circuit configured to generate a bias control signal based on the excess current satisfying a threshold and provide the bias control signal to the internal current generator, wherein the internal current generator is configured to increase at least one of the plurality of internal bias currents based on the bias control signal.

Aspect 8: The magnetic field sensor chip of Aspect 4, wherein the shunt regulator comprises a resistive voltage divider, a differential amplifier, and a pass transistor coupled in parallel to the resistive voltage divider, wherein the resistive voltage divider is configured to receive a portion of the external bias current at a divider input node and provide an output voltage at a divider output node, wherein the differential amplifier includes a non-inverting input coupled to the divider output node, an inverting input coupled to a reference voltage supply, and a differential amplifier output coupled to a control terminal of the pass transistor, and wherein the pass transistor is configured to sink an excess current of the external bias current.

Aspect 9: The magnetic field sensor chip of Aspect 8, wherein the internal current generator is coupled in parallel to the pass transistor.

Aspect 10: The magnetic field sensor chip of any of Aspects 1-9, further comprising: a plurality of switches coupled to the Hall sensor, wherein the plurality of switches is configured to provide the first internal bias current to the Hall sensor based on a spinning current scheme, and output the sensor signal based on the spinning current scheme.

Aspect 11: The magnetic field sensor chip of Aspect 10, further comprising: an external control terminal configured to receive a control signal for controlling the plurality of switches to implement the spinning current scheme.

Aspect 12: The magnetic field sensor chip of Aspect 11, further comprising: a chopper circuit configured to receive the amplified sensor signal and the control signal, and demodulate the amplified sensor signal based on the control signal.

Aspect 13: The magnetic field sensor chip of Aspect 11, wherein the sensor signal is a differential signal comprising a first sensor signal provided by a first output of the Hall sensor and a second sensor signal provided by a second output of the Hall sensor, wherein the amplifier is configured to amplify the first sensor signal into a first amplified sensor signal based on the second operating point and amplify the second sensor signal into a second amplified sensor signal based on the second operating point, and wherein the magnetic field sensor chip further comprises a chopper circuit configured to receive the first amplified sensor signal, the second amplified sensor signal, and the control signal, and demodulate the first amplified sensor signal and the second amplified sensor signal into DC signals based on the control signal.

Aspect 14: The magnetic field sensor chip of Aspect 10, further comprising: an internal oscillator configured to generate an oscillator signal for controlling the plurality of switches to implement the spinning current scheme, wherein the spinning current scheme modulates an offset component of the sensor signal to a different frequency band outside of a frequency band of the sensor signal; and an offset removal circuit coupled to an output of the amplifier, wherein the offset removal circuit is configured to remove offset components from the amplified sensor signal.

Aspect 15: The magnetic field sensor chip of Aspect 14, wherein the offset removal circuit includes a filter configured to remove signal components of the amplified sensor signal located in the different frequency band, including the offset components, to generate a filtered sensor signal.

Aspect 16: The magnetic field sensor chip of Aspect 15, further comprising: an output buffer configured to receive the filtered sensor signal and provide a low ohmic output that has a lower impedance than the filter by at least a factor of 10, wherein the output buffer is configured to output the filtered sensor signal.

Aspect 17: The magnetic field sensor chip of Aspect 14, wherein the offset removal circuit includes an offset ripple loop coupled as a feedback loop between an output of the amplifier and an input of the amplifier.

Aspect 18: The magnetic field sensor chip of Aspect 14, further comprising: a demodulator configured to receive the amplified sensor signal and the oscillator signal, and demodulate the amplified sensor signal into a DC signal based on the oscillator signal.

Aspect 19: A Hall sensor system configured to receive an external bias current from an external current source, the Hall sensor system comprising: an internal current generator configured to split the external bias current into a plurality of internal bias currents, including a first internal bias current and a second internal bias current; a Hall probe configured to be biased by the first internal bias current and set at a first operating point based on the first internal bias current, wherein the Hall probe is further configured to generate a sensor signal based on a magnetic field and the first operating point; and an amplifier configured to be biased by the second internal bias current and set at a second operating point based on the second internal bias current, wherein the amplifier is configured to amplify the sensor signal into an amplified sensor signal based on the second operating point, wherein the Hall sensor system is integrated on a semiconductor chip.

Aspect 20: A method of operating a Hall sensor system integrated on a semiconductor chip, the method comprising: receiving, by an input terminal, an external bias current from an external current source; splitting, by an internal current generator, the external bias current into a plurality of internal bias currents, including a first internal bias current and a second internal bias current; biasing a Hall sensor with the first internal bias current to set the Hall sensor at a first operating point; generating, by the Hall sensor, a sensor signal based on a magnetic field and the first operating point; biasing an amplifier with the second internal bias current to set the amplifier at a second operating point; and amplifying, by the amplifier, the sensor signal into an amplified sensor signal based on the second operating point.

Aspect 21: A system configured to perform one or more operations recited in one or more of Aspects 1-20.

Aspect 22: An apparatus comprising means for performing one or more operations recited in one or more of Aspects 1-20.

Aspect 23: A non-transitory computer-readable medium storing a set of instructions, the set of instructions comprising one or more instructions that, when executed by a device, cause the device to perform one or more operations recited in one or more of Aspects 1-20.

Aspect 24: A computer program product comprising instructions or code for executing one or more operations recited in one or more of Aspects 1-20.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, and a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A magnetic field sensor chip, comprising:

an input terminal configured to receive an external bias current from an external current source;

an internal current generator configured to split the external bias current into a plurality of internal bias currents, including a first internal bias current controlled by the internal current generator and a second internal bias current controlled by the internal current generator;

a Hall sensor configured to be biased by the first internal bias current and set at a first operating point based on the first internal bias current, wherein the Hall sensor is further configured to generate a sensor signal based on a magnetic field and the first operating point; and an amplifier configured to be biased by the second internal bias current and set at a second operating point based on the second internal bias current, wherein the amplifier is configured to amplify the sensor signal into an amplified sensor signal based on the second operating point.

2. The magnetic field sensor chip of claim 1, wherein the first operating point is a magnetic field sensitivity, and wherein the second operating point is configured to maintain the amplifier in an active region.

3. The magnetic field sensor chip of claim 1, wherein the internal current generator is configured to control a magnitude of the first internal bias current and a magnitude of the second internal bias current independent of the external current source, and wherein a sum of the magnitude of the first internal bias current and the magnitude of the second internal bias current is less than a magnitude of the external bias current.

4. The magnetic field sensor chip of claim 1, further comprising:

a shunt regulator configured to generate an internal supply voltage with a constant voltage level and provide the internal supply voltage to the internal current generator, the Hall sensor, and the amplifier.

5. The magnetic field sensor chip of claim 4, wherein the shunt regulator is configured to generate the internal supply voltage based on the external bias current.

6. The magnetic field sensor chip of claim 4, wherein the shunt regulator is configured to sink an excess current of the external bias current, and wherein the excess current is a remaining portion of the external bias current that is not split into the plurality of internal bias currents.

7. The magnetic field sensor chip of claim 6, wherein the shunt regulator includes:

a current sensor configured to measure the excess current; and a comparator circuit configured to generate a bias control signal based on the excess current satisfying a threshold and provide the bias control signal to the internal current generator, wherein the internal current generator is configured to increase at least one of the plurality of internal bias currents based on the bias control signal.

8. The magnetic field sensor chip of claim 4, wherein the shunt regulator comprises a resistive voltage divider, a differential amplifier, and a pass transistor coupled in parallel to the resistive voltage divider, wherein the resistive voltage divider is configured to receive a portion of the external bias current at a divider input node and provide an output voltage at a divider output node, wherein the differential amplifier includes a non-inverting input coupled to the divider output node, an inverting input coupled to a reference voltage supply, and a differential amplifier output coupled to a control terminal of the pass transistor, and wherein the pass transistor is configured to sink an excess current of the external bias current.

9. The magnetic field sensor chip of claim 8, wherein the internal current generator is coupled in parallel to the pass transistor.

10. The magnetic field sensor chip of claim 1, further comprising:

a plurality of switches coupled to the Hall sensor, wherein the plurality of switches is configured to provide the first internal bias current to the Hall sensor based on a spinning current scheme, and output the sensor signal based on the spinning current scheme.

11. The magnetic field sensor chip of claim 10, further comprising:

an external control terminal configured to receive a control signal for controlling the plurality of switches to implement the spinning current scheme.

12. The magnetic field sensor chip of claim 11, further comprising:

a chopper circuit configured to receive the amplified sensor signal and the control signal, and demodulate the amplified sensor signal based on the control signal.

13. The magnetic field sensor chip of claim 11, wherein the sensor signal is a differential signal comprising a first sensor signal provided by a first output of the Hall sensor and a second sensor signal provided by a second output of the Hall sensor, wherein the amplifier is configured to amplify the first sensor signal into a first amplified sensor signal based on the second operating point and amplify the second sensor signal into a second amplified sensor signal based on the second operating point, and wherein the magnetic field sensor chip further comprises a chopper circuit configured to receive the first amplified sensor signal, the second amplified sensor signal, and the control signal, and demodulate the first amplified sensor signal and the second amplified sensor signal into direct current (DC) signals based on the control signal.

14. The magnetic field sensor chip of claim 10, further comprising:

an internal oscillator configured to generate an oscillator signal for controlling the plurality of switches to implement the spinning current scheme, wherein the spinning current scheme modulates an offset component of the sensor signal to a different frequency band outside of a frequency band of the sensor signal; and an offset removal circuit coupled to an output of the amplifier, wherein the offset removal circuit is configured to remove offset components from the amplified sensor signal.

15. The magnetic field sensor chip of claim 14, wherein the offset removal circuit includes a filter configured to remove signal components of the amplified sensor signal located in the different frequency band, including the offset components, to generate a filtered sensor signal.

16. The magnetic field sensor chip of claim 15, further comprising:

an output buffer configured to receive the filtered sensor signal and provide a low ohmic output that has a lower impedance than the filter by at least a factor of 10, wherein the output buffer is configured to output the filtered sensor signal.

17. The magnetic field sensor chip of claim 14, wherein the offset removal circuit includes an offset ripple loop coupled as a feedback loop between an output of the amplifier and an input of the amplifier.

18. The magnetic field sensor chip of claim 14, further comprising:

a demodulator configured to receive the amplified sensor signal and the oscillator signal, and demodulate the amplified sensor signal into a direct current (DC) signal based on the oscillator signal.

19. A Hall sensor system configured to receive an external bias current from an external current source, the Hall sensor system comprising:

an internal current generator configured to split the external bias current into a plurality of internal bias currents, including a first internal bias current controlled by the internal current generator and a second internal bias current controlled by the internal current generator;

a Hall probe configured to be biased by the first internal bias current and set at a first operating point based on the first internal bias current, wherein the Hall probe is further configured to generate a sensor signal based on a magnetic field and the first operating point; and an amplifier configured to be biased by the second internal bias current and set at a second operating point based on the second internal bias current, wherein the amplifier is configured to amplify the sensor signal into an amplified sensor signal based on the second operating point, wherein the Hall sensor system is integrated on a semiconductor chip.

20. A method of operating a Hall sensor system integrated on a semiconductor chip, the method comprising:

receiving, by an input terminal, an external bias current from an external current source;

splitting, by an internal current generator, the external bias current into a plurality of internal bias currents, including a first internal bias current controlled by the internal current generator and a second internal bias current controlled by the internal current generator;

biasing a Hall sensor with the first internal bias current to set the Hall sensor at a first operating point;

generating, by the Hall sensor, a sensor signal based on a magnetic field and the first operating point;

biasing an amplifier with the second internal bias current to set the amplifier at a second operating point; and amplifying, by the amplifier, the sensor signal into an amplified sensor signal based on the second operating point.

* * * * *